United States Patent
Kästli

(10) Patent No.: US 8,723,373 B2
(45) Date of Patent: May 13, 2014

(54) INTERFACE FOR CONNECTING CONVERTER APPARATUS TO TWO-POLE LINE

(75) Inventor: Urs Kästli, Männedorf (CH)

(73) Assignee: Siemens Aktiengesellschaft, Munich (DE)

( * ) Notice: Subject to any disclaimer, the term of this patent is extended or adjusted under 35 U.S.C. 154(b) by 453 days.

(21) Appl. No.: 12/733,906

(22) PCT Filed: Aug. 6, 2008

(86) PCT No.: PCT/EP2008/060358
§ 371 (c)(1),
(2), (4) Date: Jul. 9, 2010

(87) PCT Pub. No.: WO2009/043625
PCT Pub. Date: Apr. 9, 2009

(65) Prior Publication Data
US 2010/0295370 A1    Nov. 25, 2010

(30) Foreign Application Priority Data
Sep. 27, 2007    (EP) ..................... 07117423

(51) Int. Cl.
*G05F 3/06*    (2006.01)

(52) U.S. Cl.
USPC ............ 307/151; 307/132; 307/139

(58) Field of Classification Search
CPC ...................................... G05F 3/06
USPC ........................ 307/151, 132, 139
See application file for complete search history.

(56) References Cited

U.S. PATENT DOCUMENTS

| 4,219,803 A | 8/1980 | Kuwabara et al. |
| 5,940,280 A * | 8/1999 | Murai et al. ............... 363/17 |
| 6,738,238 B2 | 5/2004 | Lontka et al. |
| 2003/0048652 A1 * | 3/2003 | Lontka et al. ............ 363/125 |

FOREIGN PATENT DOCUMENTS

| DE | 10 2005 037 047 B3 | 12/2006 |
| DE | 10 2006 006 541 B3 | 7/2007 |

OTHER PUBLICATIONS

English Abstract for Japanese Published Patent Application No. 2000-97783 A1 published Apr. 7, 2000.
International Search Report for Application No. PCT/EP2008/060358; mailed Oct. 10, 2008.

\* cited by examiner

*Primary Examiner* — John Breene
*Assistant Examiner* — Haihui Zhang
(74) *Attorney, Agent, or Firm* — Staas & Halsey LLP

(57) ABSTRACT

The interface has three inputs, a first output which is connected to a first input, a second output which can be connected to a second input or to the third input. The interface also includes a switching device which is connected to the second input, the third input and the second output, and a control device which is coupled to the third input in such a way that a detection signal can be fed from the third input to the control device. The detection signal is indicative of whether the second input or the third input is connected to the second pole of the two-pole line.

10 Claims, 3 Drawing Sheets

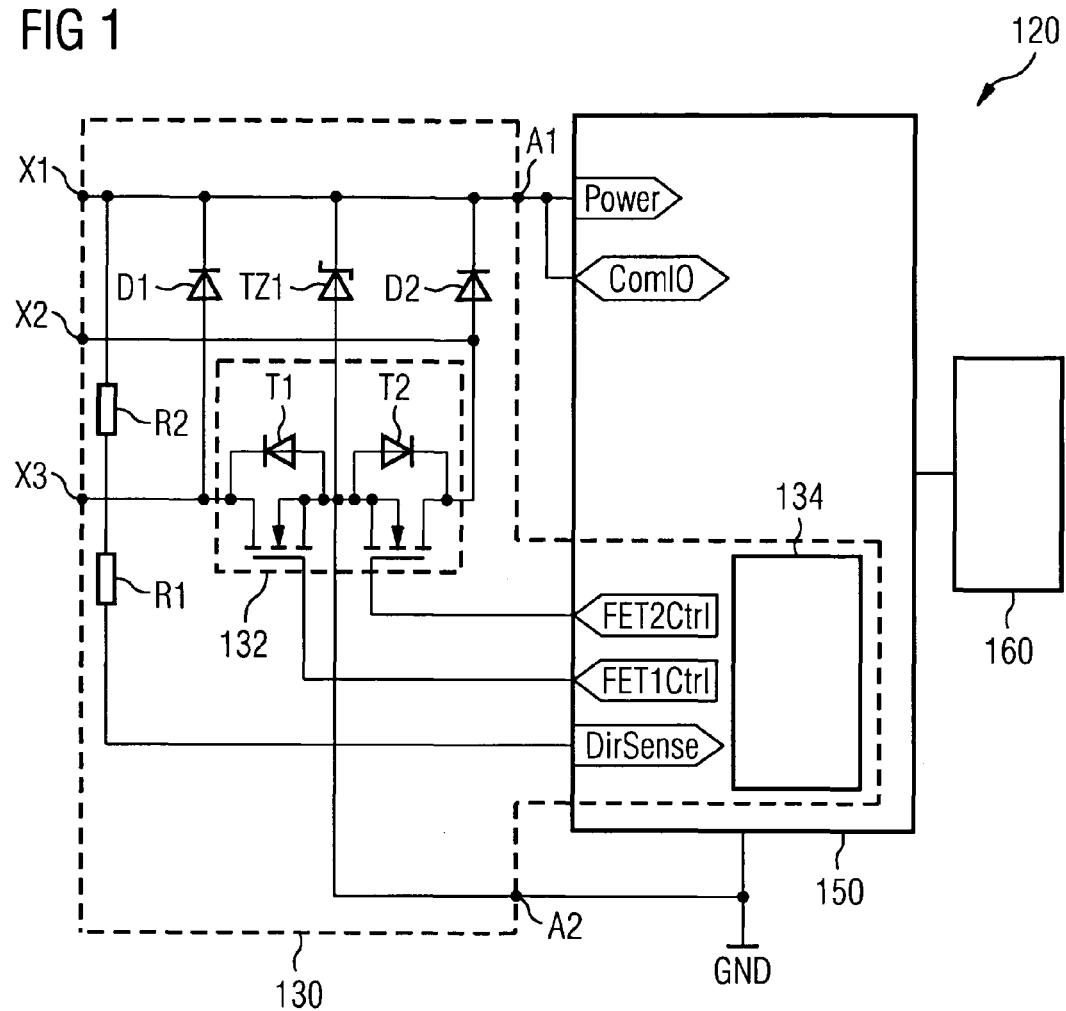

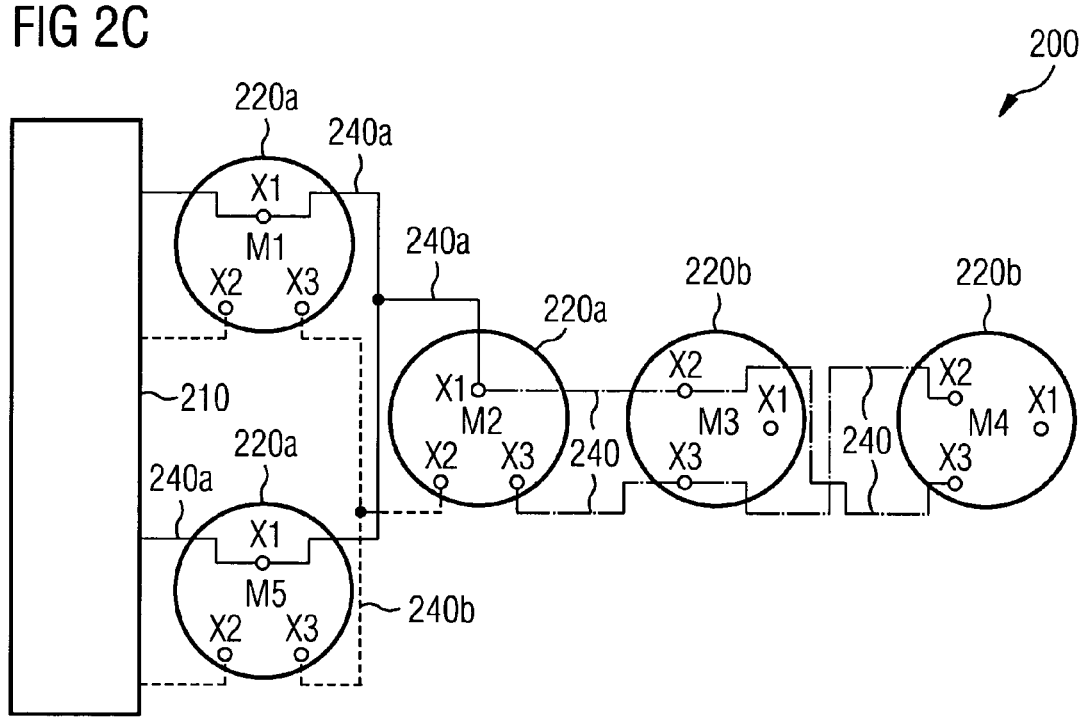

INTERFACE FOR CONNECTING CONVERTER APPARATUS TO TWO-POLE LINE

CROSS REFERENCE TO RELATED APPLICATIONS

This application is the U.S. national stage of International Application No. PCT/EP2008/060358, filed Aug. 6, 2008 and claims the benefit thereof. The International Application claims the benefits of European Application No. 07117423 filed on Sep. 27, 2007, both applications are incorporated by reference herein in their entirety.

BACKGROUND

Described below is an interface which relates to the technical field of electrical or electronic circuit engineering. The interface connects a converter apparatus to a two-pole line, a first pole having a higher electrical potential and the second pole having a lower electrical potential. The interface may be used in a converter system or a converter unit to connect a converter apparatus.

In Europe standards and installation guidelines in the field of automatic fire alarm technology require a fire alarm line to be protected against total failure due to a line short circuit in many applications. This requirement is currently met either by short circuit isolator elements inserted at specific points of the fire alarm line in addition to the actual sensors and actuators or by a short circuit isolator integrated in every sensor or actuator and a loop line structure. A short circuit isolator is described for example in EP 0 111 178 B1, which discloses a monitoring unit with a number of alarms linked in a chain-type manner to a loop-type alarm line, the alarms being connected to a control center with an evaluation unit. The evaluation unit can determine the nature of the operating states of the individual alarms by way of the temporal pattern of a polling voltage. A short circuit in the alarm line between two adjacent alarms can also be detected and located. Selective deactivation of the part of the alarm line in which the short circuit occurred allows the overall operating voltage to be maintained on the remainder of the alarm line.

In markets outside Europe, particularly in the United States of America, there is often no requirement to maintain the functionality of the alarm line in the event of short circuits. However the connection of a frequently very large number of sensors and actuators to such a two-pole line should be achieved as rationally and with as few possibilities for error as possible. It is therefore advantageous if the generally polarized alarm line can be connected to the devices without observing polarity. Thus for example U.S. Pat. No. 6,738,238 B2 discloses a fire alarm unit having a control center and a number of alarm devices. The alarm devices are connected to the control center by way of a two-point line, the two-point line serving both to supply power to the individual alarm devices and to signal various operating states of the individual alarm devices from the alarm devices to the control center. An alarm device is coupled to the two-point line in each instance by way of a current and signal interface which operates independently of the polarity of the respective connection. This allows the individual alarm devices to be operated independently of polarity. The current and signal interfaces each have a rectifier, which has a not inconsiderable susceptibility to noise and thus influences the operational reliability of the alarm devices disadvantageously.

SUMMARY

An aspect is to improve the possibilities for connecting a converter apparatus to a two-pole line in respect of safety requirements in Europe and outside Europe.

According to a first aspect, an interface for connecting a converter apparatus to a two-pole line is described, a first pole of the line having a higher electrical potential and the second pole of the line having a lower electrical potential. The described interface has (a) a first input, (b) a second input, (c) a third input, (d) a first output, which is connected to the first input, and (e) a second output, which can be connected to the second input or the third input. The described interface also has (f) a switching facility, which is connected to the second input, the third input and the second output, and (g) a control facility, which is coupled to the third input such that a detection signal can be fed from the third input to the control facility indicating whether the second input or the third input is connected to the second pole of the two-pole line and which is connected to the switching facility. The control facility is set up so that the second input or alternatively the third input is connected to the second output based on the detection signal.

The development of the described interface is based on the knowledge that when the described interface is used to connect a converter apparatus, it is possible to avoid errors in respect of the polarity of the connection in an effective manner. The described interface itself identifies whether the second input or the third input is connected to the second pole, i.e. to the pole with the lower electrical potential, of the two-pole line. The control facility ensures that the state of the switching facility is such that the more negative pole of the two-pole line is connected to the second output. A negative connection of the converter apparatus can then be connected to this output.

The use of three inputs, of which only two are used to supply power to the interface and/or a converter apparatus connected thereto, provides two different connection possibilities, which can be tailored elegantly to safety regulations in Europe and safety regulations applicable outside Europe.

If the first pole of the two-pole line is connected to the first input of the described interface, the higher potential of the two-pole line is directly present at the first output due to the direct connection between the first input and the first output. A positive connection of the converter apparatus can then be connected to this.

It should be noted that unless otherwise stated, the term "connection" in the context of this application always refers to an "electrical connection". An electrical connection can result here by way of a resistance tailored to the respective signal current strength or by a diode connected in the forward direction as well as a direct wire connection.

The converter apparatus can in principle be any apparatus that converts an input variable to an output variable. In hazard alarm technology the converter apparatus can be an alarm facility such as a sensor, an optical and/or acoustic evacuation controller or evacuation aid, an optical and/or acoustic display facility or any other device that helps people leave the hazard area in the event of a hazard. Possible sensors are for example fire detectors, smoke detectors, temperature detectors, odor detectors and/or chemical detectors, which can identify a hazard situation as a function of the respective hazard.

However the converter apparatus can also be an actuator, which opens or closes a door for example in the event of a hazard.

It should be noted that the terms "higher" or as the case may be "more positive" and "lower" or as the case may be "more negative" relate in each instance to the electrical potentials actually present and not the amounts of the potentials. Naturally one of the potentials can also be the ground for the converter apparatus. The negative potential may be used for this, being present at the second output of the interface.

It should also be noted that the described interface can also be operated with reversed polarity. The first pole of the two-pole line then has a lower electrical potential, while the second pole of the two-pole line has a higher electrical potential.

The two pole line can be a known wire conductor, which is provided in the known manner both to supply the converter apparatus with electrical energy and to forward the signal of a measurement signal. The measurement signal here can contain information about a measurement value and/or an operating state of the converter apparatus to a control center.

According to one exemplary embodiment, the interface also has (a) a first rectifier element, which is connected between the third input and the first output, and (b) a second rectifier element, which is connected between the second input and the first output. The two rectifier elements here are oriented in such a manner that the second input and the third input connect the input connected to the first pole of the two-pole line to the first output.

This means that if it is not the first input but either the second or third input, which is connected to the positive pole of the two-pole line, this positive connection is connected automatically to the first output.

The rectifier elements can be simple diodes for example, which only permit current to flow in one direction.

It should be noted that the switching facility can also have one or more diodes. These diodes can also be parasitic or inherent diodes of transistors, which are used as switching elements within the switching facility. These inherent diodes can also represent a passive rectification, so that the first output is always connected to the positive pole of the two-pole line. The second output is always correspondingly connected to the negative pole of the two-pole line.

According to a further exemplary embodiment, the switching facility has (a) a first switching element, which is disposed between the third input and the second output, and (b) a second switching element, which is disposed between the second input and the second output.

The two switching elements can be transistors, in particular field effect transistors. Appropriate activation of these transistors by the control facility allows the input connected to the second pole of the two-pole line to be connected to the second output in a simple manner.

According to a further exemplary embodiment, the two switching elements can be activated by the control facility independently of one another. This means that the control facility can also ensure that the state of the switching facility is one in which both switching elements are closed. It is thus possible to establish a low-resistance electrical connection between the second input and the third input. The effective electrical resistance across the two switching elements here can be lower than the input resistance of a converter apparatus connected to the outputs of the interface.

A lower resistance connection between the second input and the third input compared with the input resistance of the converter apparatus can be used, if a number of interfaces with corresponding converter apparatuses are connected to a control center by way of the two-pole line, so that a further interface can be addressed by the control center, which can then forward information about its operating state to the control center in the known manner by way of the two-pole line.

It is thus possible, with a sequential further connection, achieved by closing or switching through both transistors, for all the interfaces or converter apparatuses connected to the two-pole line to be polled one after the other by the control center.

The control facility can also activate the two switching elements so that both switching elements are open, so that neither the second input nor the third input is connected to the second output. This means that the converter apparatus connected to the described interface and optionally further interfaces or converter apparatuses connected downstream of the interface by way of the two-pole line are isolated from the negative pole of the two-pole line. This can then advantageously be used when a short circuit has formed after a certain interface in the two-pole line going out from a control center. The described isolating functionality of the interface allows the corresponding section of the two-pole line to be isolated in a simple manner and the operation of converter apparatuses disposed between the part of the line affected by the short circuit and the control center therefore to be maintained.

In the case of a loop line going out from the control center, if there is just one short circuit all the converter apparatuses can thus continue to be operated. The converter apparatuses on the one side of the loop line here are supplied by way of the one branch of the isolated loop line and the converter apparatuses on the other side of the loop line are supplied by way of the other branch of the isolated loop line.

According to a further exemplary embodiment, the interface also has an overvoltage protection facility, which is connected between the first output and the second output.

The overvoltage protection facility can be a simple Zener diode for example. In some instances interacting with the switching facility and/or with the rectifier elements described above, this can protect the electronic system of the converter apparatus and/or the control facility of the described interface effectively against transient overvoltage on the two-pole line, which is fed in for example by a capacitive or inductive coupling.

According to a further exemplary embodiment, the interface also has a first resistance for picking up the detection signal.

The first resistance can be disposed here between the third input and the control facility. The first resistance may be dimensioned in respect of its resistance value such that, regardless of the circuitry of the three inputs, the flow of current toward the control facility is so small that the control facility is protected against damage.

The use of an appropriately dimensioned first resistance for picking up the detection signal or detection voltage has the advantage that the polarity of the supply voltage present at the third input is detected directly based on the sign in front of the detection voltage.

According to a further exemplary embodiment, the interface also has a second resistance, which is connected between the first input and the second input. This has the advantage that in the event that the second input is not connected to the two-pole line, the detection signal has the same sign in respect of its polarity as the supply voltage present at the first input. It is thus always possible to ensure that the converter apparatus is connected with the correct polarity by way of the described interface, regardless of the assignment of the two poles of the two-pole line to the three inputs. The control facility here can essentially have the functionality of a logic unit, which activates the switching facility appropriately as a function of the polarity of the input signal.

According to a second aspect, a converter system is described for reporting and/or dealing with a hazard situation, which can occur in particular in a building. The converter system has (a) a converter apparatus, (b) an electronic module for operating the converter apparatus and (c) an interface of the type described above.

The described converter system is based on the knowledge that the interface described above automatically ensures that the converter apparatus is connected with the correct polarity, so that when the converter apparatus is connected electrically to a two-pole line, electrical assembly errors in respect of polarity can be reliably prevented.

The control facility of the interface can also be assigned to the electronic module so that the interface apart from the control facility can be configured by a simple electronic circuit.

To report a hazard situation the converter apparatus has a sensor, an optical and/or acoustic evacuation controller or evacuation aid, an optical and/or acoustic display facility or any other device that helps people leave the hazard area in the event of a hazard. As already mentioned above, possible sensors are for example fire detectors, smoke detectors, temperature detectors, odor detectors and/or chemical detectors, which can identify a hazard situation as a function of the respective hazard.

The described converter system is suitable for dealing with a hazard situation if the converter apparatus has an actuator or final control element, which can be used to eliminate the hazard situation at least partially. In the case of a fire the converter apparatus can for example prompt a door to be opened or closed automatically or other suitable firefighting measures, for example activating a sprinkler system, to be initiated automatically and promptly.

According to a third aspect, a converter unit is described for reporting and/or dealing with a hazard situation, which can occur in particular in a building. The described converter unit has (a) a converter system of the structure described above, (b) a control center and (c) a two-pole line, which connects the converter system to the control center. The control center and the converter system are configured so that the converter system can be supplied with electrical energy by the control center and information about the operating state of the converter system can be transmitted from the converter system to the control center by way of the two-pole line.

The described converter unit is based on the knowledge that the converter system described above automatically ensures that the converter apparatus is connected to the control center with the correct polarity. This allows the converter unit for reporting and/or dealing with a hazard situation to be operated reliably, avoiding electrical assembly errors.

According to one exemplary embodiment, the converter unit also has at least one further converter system of the structure described above, which is likewise connected to the two-pole line. The various converter systems here can be connected to the control center in the same manner or in a different manner.

(A) A first connection type may be characterized in that correct polarity has to be maintained in relation to the supply voltage at least in respect of connection to the first input. For example it must be ensured that the first connection is connected to the first pole or the higher electrical potential of the two-pole line. When the rectifier elements described above are used, it is irrelevant whether the second pole of the two-pole line with the lower potential is connected to the second or third input. The interface will automatically connect the contacted second or third input to the second output.

This first connection type also may be characterized by an isolating functionality, which is achieved by appropriate activation of the switching facility, in that both or at least one of the switching elements of the switching facility described above is/are opened. Such opening of the two switching elements, or at least of the switching element connected directly to the connection to a further converter system, of the interface of the converter system allows the further converter system for example, which is behind the converter system from the point of view of the control center, to be isolated from the control center. This is particularly significant if the line has a short circuit in the region between the converter system and the further converter system.

Closing the two switching elements also allows a low-resistance connection to be established between the second and third inputs. This allows signals to be transmitted by way of the two-pole line for the purposes of signaling to and/or from the further converter system, the signals being used by the control center to control the further converter system or coding information about the operating state of the further converter system, without or with only slight interference on the part of the converter system.

(B) A second connection type may be characterized in that it is ensured during connection that neither the first pole nor the second pole of the two-pole line is connected to the first input. No particularities have to be taken into account during assembly with regard to the polarity of the electrical connections to the second and third inputs. A connection with correct polarity can automatically be ensured due to the rectifier elements described above.

It should be pointed out specifically here that the two connection types described can be combined within a converter unit. This means that at least one converter system can be connected to a common control center using the first connection type (A) and at least one further converter system can be connected to a common control center using the second connection type (B).

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 1 is a basic circuit diagram of a hazard alarm, having an interface, which allows two different types of connection to a two-pole alarm line.

FIG. 2c is a block diagram for a combined installation of five hazard alarms, three hazard alarms being connected to a control center taking into account polarity with failure protection in the event of interruption and short circuit and two hazard alarms being connected to a control center independently of polarity without failure protection.

DETAILED DESCRIPTION OF THE PREFERRED EMBODIMENT

Figure 2A:
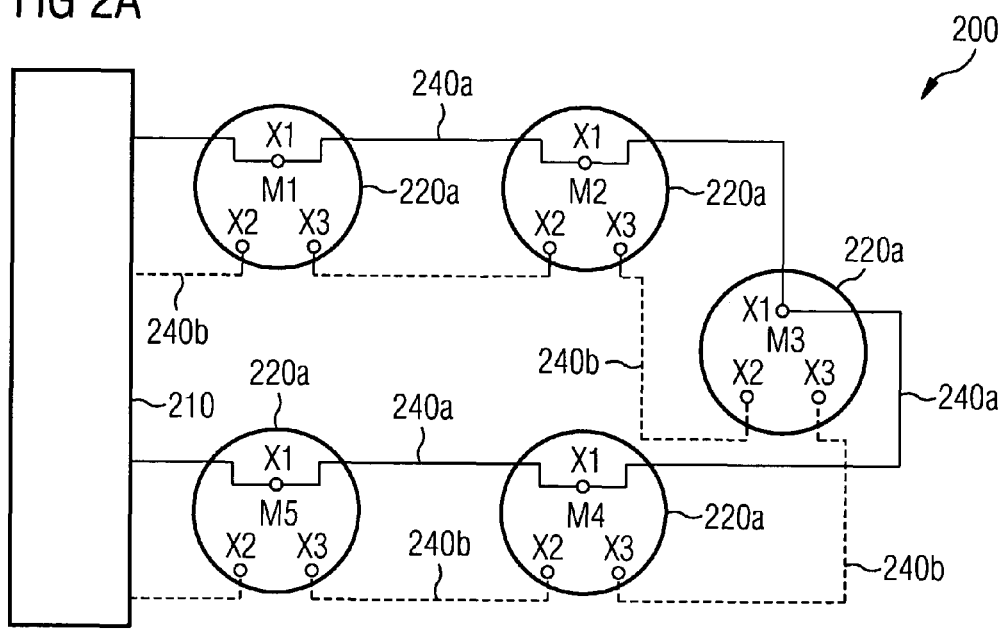
FIG. 2a is a block diagram for five hazard alarms, which are connected to a control center by way of an alarm loop line according to a first connection type taking into account polarity.

It should be noted here that the reference characters of identical or corresponding components only differ in their first figure and/or by an appended letter in the drawing.

FIG. 1 shows a basic circuit diagram of a hazard alarm 120, which has a converter apparatus 160, which can be connected by way of an interface 130 to a two-pole alarm line (not shown). According to the exemplary embodiment shown here the converter apparatus is a hazard alarm facility such as a fire detector, smoke detector, temperature detector, odor detector and/or chemical detector. The converter apparatus can however also be an actuator, which opens or closes a door for example in the event of a hazard. The converter apparatus 160 also has an electronic module 150, by way of which electrical energy is fed from the alarm line to the converter apparatus 160 and/or which is used for communication between the converter apparatus 160 and a control center (likewise not shown in FIG. 1).

The interface 130 has three inputs, a first input X1, a second input X2 and a third input X3. The interface 130 also has two outputs, a first output A1 and a second output A2. The second output A2 represents a ground GND for the hazard alarm 120 as a whole.

The first output A1 is connected by way of a direct wire connection to the first input X1. The first output A1 is also connected both to a voltage supply input Power and to a communication input ComIO of the electronic module 150. As described in more detail below, the second output A2 can be connected to the second input X2 or the third input X3.

The interface also has a switching facility 132, which includes a first switching element T1 and a second switching element T2. According to the exemplary embodiment shown here the two switching elements T1 and T2 are field effect transistors. The two switching elements T1 and T2 are each connected by way of their own line to a control facility 134. The first switching element can be opened or closed specifically by a first control signal FET1Ctrl. In the closed state of the first switching element T1 the second output A2 is connected to the third input X3. The second switching element can be opened or closed specifically by a second control signal FET2Ctrl. In the closed state of the second switching element T2 the second output A2 is connected to the second input X2.

The control facility 134 is fed a detection signal DirSense, which is picked up by the two inputs X2 and X3 by way of two resistances, a first resistance R1 and a second resistance R2. As described in more detail below the sign in front of the signal DirSense is a direct indication of the electrical connection of the interface 130.

The interface 130 also has two rectifier elements configured as diodes, a first diode D1 and a second diode D2. These diodes D1 and D2 together with the inherent diodes of the transistors T1 and T2 form a passive rectifier. The rectifier ensures that the first output A1 is always connected to the positive pole of the two-pole line. The second output A2 is correspondingly always connected to the negative pole of the two-pole line.

An overvoltage protection facility TZ1 is also provided to protect the interface 130 and/or the converter apparatus 160, being connected between the first input X1 and the third input X3. According to the exemplary embodiment shown here the overvoltage protection facility is a Zener diode TZ1.

As indicated above, the hazard alarm 120 illustrated in FIG. 1 can be connected to a two-pole alarm line in two fundamentally different ways. In both instances the ground or device mass is connected to the negative pole of the alarm line in a low-resistance manner. A first polarity-dependent connection type (A) is wherein the first input X1 has to be connected to the positive pole of the alarm line. A second polarity-independent connection type (B) is wherein the first input X1 is connected neither to the positive nor to the negative pole of the alarm line and therefore remains uncontacted.

(A) Polarity-dependent connection of the hazard alarm 120 with isolation functionality for the minus conductor by way of the always positive first input X1 and the two inputs X2 and X3:

The inherent diodes in the transistors T1 or T2 allow a flow of current between the ground GND or the second output A2 and the input X2 or X3 connected to the negative pole of the alarm line. This means that the electronic module 150 is supplied with a positive voltage toward the inputs X2 or X3 by way of the input X1 when the field effect transistors T1 and T2 are blocked.

The electronic module 150 can identify from the sign in front of the detector signal DirSense whether the third input X3 or the second input X2 is connected to the negative potential of the alarm line or the alarm connection line. If the third input X3 is connected to this negative potential, the control facility 134 will close the transistor T1 by way of the first control signal FET1Ctrl. If the second input X2 is connected to this negative potential, the control facility 134 will close the transistor T2 by way of the second control signal FET2Ctrl. The electronic module 150 is therefore now connected to the minus potential of the alarm connection line in a low-resistance manner.

The amount of information provided by the signal DirSense in respect of the contacting of the hazard alarm 120 results from the following consideration:

If the third input X3 is connected to the negative potential of the alarm line and the second input X2 is not contacted or is connected to an input of a subsequent hazard alarm, when the transistors T1 and T2 are respectively opened, a flow of current results from the first input X1 by way of the connection A1 through the electronic module 150 and by way of the connection A2 and the inherent diode of the transistor T1 to the third input X3. The second output X2 or ground GND will then experience a known diode potential drop across the third input X3. This means that the potential of the third input and—by way of the resistance R1—also the signal DirSense experience a diode potential drop below the ground GND. The control facility 134, which is assigned to the electronic module 150, is then fed a negative signal DirSense.

If the second input X2 is connected to the negative potential of the alarm line and the third input X3 is not contacted or is connected to an input of a subsequent hazard alarm, when the transistors T1 and T2 are respectively opened, a flow of current results from the first input X1 by way of the connection A1 through the electronic module 150 and by way of the connection A2 and the inherent diode of the transistor T2 to the second input X2. The signal DirSense, which is picked up by the first input X1 by way of the two resistances R1 and R2, is therefore close to the positive potential of the first input X1. The control facility 134 is therefore fed a positive signal DirSense.

To switch the alarm line further to a subsequent hazard alarm, which is likewise connected to the alarm line, the control facility 134 can close the still open transistor T2 or T1. If the next section of the alarm line between this hazard alarm 120 and the subsequent hazard alarm is subject to a short circuit, it is possible by repeated opening of this transistor to isolate the faulty line section by interrupting the minus pole of the alarm line.

(B) Polarity-independent connection of the hazard alarm 120 without isolating functionality for the minus connector by way of the inputs X2 and X3, the input X1 is not used:

The diodes D1 and D2 and the inherent diodes of the field effect transistors T1 and T2 form a passive rectifier when transistors T1 and T2 are blocked. The electronic module 150 is supplied with a positive voltage at the input Power toward the ground connection GND by way of this rectifier.

As explained above, the control facility 134 can also identify from the sign in front of the detection signal DirSense here whether the third input X3 is connected to the positive or negative potential of the alarm connection line. If the third input X3 is connected to the negative potential, the control facility 134 will close the transistor T1 by way of the first control signal FET1Ctrl. If the second input X2 is connected to the negative potential, the control facility 134 will close the transistor T2 by way of the second control signal FET2Ctrl. The electronic module 150 is therefore now connected to the minus potential of the alarm connection line in a low-resistance manner.

The hazard alarm 120 shown in FIG. 1 with three inputs for the two-pole alarm line can thus act on the alarm line in the manner of a short circuit isolator or connect the alarm line to the electronic module with the correct polarity, depending on the connections selected. The closed transistor T1 or T2, which ensures the connection of the alarm line to the electronic module 150 with the correct polarity, can be selected by a simple logic functionality in the electronic module 150, the logic functionality evaluating the signal DirSense appropriately. In both connection variants the interface 130 ensures the low-resistance connection of the electronic module 150 to one of the reference conductors of the alarm line.

According to the exemplary embodiment shown here the ground of the hazard alarm 120 is connected to the minus potential of the alarm line. Other circuits of identical functionality can of course be used for connection to the plus conductor.

The low-resistance connection between the ground of the hazard alarm 120 and the minus potential of the alarm line has the advantage that even when the hazard alarm 120 or the alarm line is subjected to electromagnetic radiation, interference-free communication can still take place by way of the alarm line and the communication input ComIO. This ensures that the often very sensitive electronic evaluation system of the converter apparatus 160 does not supply highly falsified results.

FIG. 2a shows a converter unit 200, having a control center 210, a two-pole alarm line with a plus conductor 240a and a minus conductor 240b and five hazard alarms 220a, which are connected according to the first polarity-dependent connection type (A). The alarm line is a known loop line, so that each hazard alarm 220a is connected to the control center 210 by way of two paths when the alarm line is free of interruptions and short circuits. The polarity-dependent connection type (A) shown in FIG. 2a allows full functionality to be maintained in the event of a simple interruption or short circuit error.

Figure 2B:
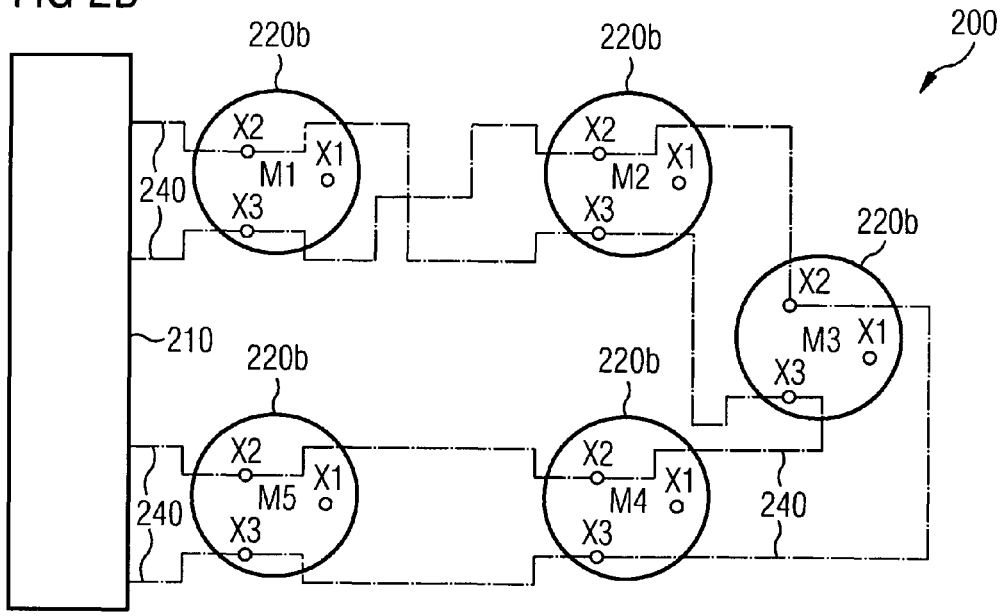
FIG. 2b is a block diagram for five hazard alarms, which are connected to a control center by way of an alarm loop line according to a second connection type not taking into account polarity.

FIG. 2b shows a converter unit 200, which likewise has a control center 210, a two-pole alarm line 240 and five hazard alarms 220b. These hazard alarms 220b are connected to the control center 210 by way of the alarm line 240 configured as a loop line according to a second connection type (B) without taking account of polarity. The polarity-independent connection type (B) shown in FIG. 2b only allows functionality to be maintained in the event of interruption errors. It is not possible to maintain functionality in the event of a short circuit error in the alarm line. The connection type shown in FIG. 2b therefore has the advantage that the converter unit 200 as a whole can be installed without taking into account the polarity of the hazard alarms 220a.

FIG. 2c shows a converter unit 200 with a control center 210, a two-pole alarm line 240 with a plus conductor 240a and a minus conductor 240b and five hazard alarms 220a and/or b.

Three hazard alarms 220a are connected according to the first connection type (A) taking into account polarity with protection against failure in relation to interruption and short circuits of the alarm line. Two hazard alarms 220b are connected according to the second connection type (B) without taking into account polarity. This combined installation shown in FIG. 2c allows full functionality to be maintained in the event of a simple line error for the hazard alarms 220a on the alarm line loop. For the hazard alarms 220b, which are connected without taking into account polarity to the line feed from the alarm line loop, functionality maintenance is only ensured in the event of interruption errors of the alarm line.

To summarize: the interface described in this application allows the same hazard alarm to be connected to a two-pole alarm line with two different connection types. According to a first polarity-dependent connection type (A) functionality maintenance can be ensured even in the event of a short circuit, with the interface of the hazard alarm taking over the short circuit isolation functionality. According to a second polarity-independent connection type (B) functionality maintenance cannot be ensured in the event of a short circuit in a section of an alarm line. The hazard alarm according to the connection system (A) with short circuit isolator functionality can also be connected at any point of the alarm line at which isolation must be possible without additional short circuit isolators for applications where partial functionality maintenance is required in the event of a short circuit, while all other devices can be wired using the polarity-independent connection type (B).

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. An interface for connecting a converter apparatus to a two-pole
    line including, a pole having a higher electrical potential and a pole having a lower electrical potential, the interface comprising:
    a first input;
    a second input;
    a third input;
    a first output connected to the first input;
    a second output connectable to at least one of the second input and the third input;
    a switching circuit connectable to the second input, the third input and the second output; and
    a control circuit, coupled to the third input to receive a detection signal indicating which of the second and third inputs is connected with the pole having the lower electrical potential and which of the second and third inputs is connected with the switching circuit,
    wherein the control circuit selectively enables connection between a respective input identified as being connected with the pole having the lower electrical potential based on the detection signal received and the second output.

2. The interface as claimed in claim 1, comprising:
    a first rectifier element connected between the third input and the first output; and
    a second rectifier element, which is connected between the second input and the first output, the two rectifier elements being oriented in such a manner that the second input and the third input connect an input connected to the first pole of the two-pole line to the first output.

3. The interface as claimed in claim 2, wherein the switching circuit includes
a first switching element disposed between the third input and the second output; and
a second switching element disposed between the second input and the second output.

4. The interface as claimed in claim 3, wherein the first and second switching elements are activatable by the control circuit independently.

5. The interface as claimed in claim 4, comprising an overvoltage protection circuit, which is connected between the first output and the second output.

6. The interface as claimed in claim 5, further comprising a first resistance to obtain the detection signal.

7. The interface as claimed in claim 6, further comprising a second resistance connected between the first input and the second input.

8. A converter system for at least one of reporting and dealing with a hazard situation in a building with a two-pole line having a first pole with a higher electrical potential and a second pole with a lower electrical potential, the converter system comprising:
a converter apparatus;
an electronic module for operating the converter apparatus; and
an interface including
a first input;
a second input;
a third input;
a first output connected to the first input;
a second output connectable to at least one of the second input and the third input;
a switching circuit connectable to the second input, the third input and the second output; and
a control circuit, coupled to the third input to receive a detection signal indicating which of the second and third inputs is connected with the second pole having the lower electrical potential of the two-pole line and which of the second and third inputs is connected with the switching circuit,
wherein the control circuit selectively enables connection between a respective input identified as being connected with the pole having the lower electrical potential based on the detection signal received and the second output.

9. A converter unit for at least one of reporting and dealing with a hazard situation in a building, the converter unit comprising:
a two-pole line having a first pole with a higher electrical potential and a second pole with a lower electrical potential;
a first converter system, connected to the two-pole line, including
a converter apparatus,
an electronic module for operating the converter apparatus, and
an interface including
a first input,
a second input,
a third input,
a first output connected to the first input,
a second output connectable to at least one of the second input and the third input,
a switching circuit connectable to the second input, the third input and the second output, and
a control circuit, coupled to the third input to receive a detection signal indicating which of the second and third inputs is connected to the second pole having the lower electrical potential of the two-pole line and which of the second and third inputs is connected to the switching circuit, the control circuit selectively enabling connection between a respective input identified as being connected with the pole having the lower electrical potential based on the detection signal received and the second output;
a control center, connected to the two-pole line, the control center controlling electrical energy supplied to the first converter system and receiving information about an operating state of the first converter system by way of the two-pole line.

10. The converter unit as claimed in claim 9, further comprising at least one additional converter system configured like the first converter system and connected to the two-pole line.

* * * * *